US007796768B2

(12) United States Patent
Manrique

(10) Patent No.: US 7,796,768 B2
(45) Date of Patent: Sep. 14, 2010

(54) VARIABLE ALIGNMENT LOUDSPEAKER SYSTEM

(75) Inventor: Pedro Manrique, Pasadena, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 1308 days.

(21) Appl. No.: 10/953,004

(22) Filed: Sep. 28, 2004

(65) Prior Publication Data

US 2006/0067553 A1 Mar. 30, 2006

(51) Int. Cl.
*H04R 3/00* (2006.01)
*H03G 5/00* (2006.01)

(52) U.S. Cl. .......................................... 381/96; 381/98

(58) Field of Classification Search .................. 381/55, 381/56, 59, 89, 97, 96, 98

See application file for complete search history.

(56) References Cited

U.S. PATENT DOCUMENTS 3,984,635 A * 10/1976 Nestorovic et al. ............ 381/97
4,403,112 A * 9/1983 Modafferi .................... 381/98
5,548,650 A * 8/1996 Clark .......................... 381/55
6,522,757 B1 * 2/2003 Hiramatsu et al. ............ 381/96
7,184,556 B1 * 2/2007 Johnson et al. ............... 381/59

FOREIGN PATENT DOCUMENTS

JP 361010397 A * 1/1986

* cited by examiner

*Primary Examiner*—Ping Lee

(57) ABSTRACT

A loudspeaker system has a primary driver and an active radiator sealed in an enclosure where the active radiator is adapted to vary its operating characteristics to tune the sound pressure level and resultant frequency response generated by a primary driver. The primary driver and the active radiator share the same acoustic volume of the enclosure, i.e., the primary driver and the active radiator share a common acoustic compliance of the internal enclosure volume. The primary driver has electromagnetic components designed to oscillate a flexible cone or diaphragm along the longitudinal axis of the primary driver. The active radiator has electromagnetic components adapted to couple to a number of electrical configuration settings. Each electrical configuration setting may affect the operating characteristics of the diaphragm of the active radiator and is reflected back electro-acoustically, through the shared volume, to the primary driver. This electro-acoustical coupling, in turn provides the tuning mechanism for the primary driver.

53 Claims, 6 Drawing Sheets

VARIABLE ALIGNMENT LOUDSPEAKER SYSTEM

BACKGROUND OF THE INVENTION

1. Field of the Invention

This invention provides a loudspeaker system having a primary driver and an active radiator sealed within an enclosure where the sound pressure level generated by the primary driver is tunable by adjusting the operational characteristics of the active radiator.

2. Related Art

A loudspeaker system, also known as an audio transducer, converts electrical energy into acoustical energy to generate sound. A loudspeaker system includes at least one "primary" transducer or driver that is mounted into an enclosure. The term "primary" generally indicates that the driver is connected to a signal source such as an amplifier or a crossover network. FIG. 1 shows a cutout view of a typical driver 100 illustrating some of its electromagnetic components. The driver 100 includes a magnet 102 and a voice coil 104 with two leads 106. The voice coil 104 is wound cylindrically around a tube like cylinder 108 and placed within an air gap 110. The tube like cylinder 108 is coupled to a diaphragm 112 that is supported by a suspension 114 and a spider 116. A dust cap 118 may be provided over the cylinder 108. The outer ends of the suspension 114 and the spider 116 may be coupled to a basket 120 to ensure that the voice coil 104 moves back and forth substantially along the axial direction. The two leads 106 from the voice coil 104, for example, may be connected to an audio amplifier that provides current through the voice coil 104 that is a function of the electrical signal to be transformed by the driver 100 into an audible, sub-audible or subsonic pressure variation. As the electrical signal from the amplifier passes through the voice coil 104, the interaction between the current passing through the voice coil 104 and the magnetic field produced by the permanent magnet 102 causes the voice coil 104 to oscillate in accordance with the electrical signal and, in turn, drives the diaphragm 112 and produces sound. As such, the driver 100 converts the electrical signal source into acoustical energy to produce sound.

A loudspeaker system typically has a driver housed in a ported enclosure or a sealed enclosure. The ported enclosure has an opening to allow sound waves to push in and out of the enclosure as the diaphragm of the driver oscillates back and forth. With the sealed enclosure, however, air inside the sealed enclosure compresses and expands as the diaphragm of the driver oscillates back and forth. In some instances, the sealed enclosure may be provided with a primary driver and a passive radiator. As discussed above, the primary driver has electromagnetic components to convert the electrical signal source into acoustical energy to produce sound. In contrast, the passive radiator has a diaphragm but no other electromagnetic components. This allows the diaphragm of the passive radiator to freely vibrate based on the pressure differential inside the sealed enclosure imparted by the primary driver. As the diaphragm of the passive radiator expands the net internal volume of the sealed enclosure increases to ease the pressure differential inside the sealed enclosure. The passive radiator may be incorporated in the sealed enclosure to improve the low frequency extension of the primary driver. This allows the diaphragm of the primary driver to extend further to increase the low frequency response.

With a sealed enclosure, the passive radiator and the primary driver share the same enclosure or the same acoustic-internal volume of the enclosure. The air compression and rarefaction caused by the primary driver push and pull on the diaphragm that is freely coupled to the passive radiator. Operating characteristics (excursion properties) of the passive radiator indicate how much force may be needed to push and pull on the diaphragm of the passive radiator. Many factors may define the operating characteristics of the passive radiator such as mass of the diaphragm, surface area of the diaphragm, material, etc. The operating characteristics of the passive radiator may partly determine the characteristics of the pressure changes within the enclosure and may have an effect on the overall performance of the primary driver. In other words, the passive radiator's resistance to push and pull movement may affect the overall performance of the primary driver. For example, if the passive radiator is very massive, then there may be greater resistance. If such is the case, the enclosure may be subject to a higher pressure, thereby affecting the overall performance of the primary driver.

One of the problems with a passive radiator is that its operating characteristics are fixed. In other words, once the loudspeaker system is constructed with a passive radiator, the operating characteristics of the passive radiator may not be changed without changing the mechanical properties of the passive radiator. Put differently, in the design phase of the loudspeaker system, appropriate design parameters are selected for a desired operating characteristic, such as mass, surface area, compliance of suspension, and material for the passive radiator. Once the design parameters of the passive radiator have been selected, however, they cannot be later changed.

Accordingly, there is a need for a loudspeaker system that may vary the operating characteristics of a passive radiator without altering mechanical properties of the passive radiator. This way, by varying the operating characteristics of the passive radiator, the overall output of the primary driver may be varied as well to improve the performance of the loudspeaker system.

SUMMARY

This invention provides a loudspeaker system having an active radiator that can vary its operating characteristics to tune the sound pressure level generated by a primary driver. The loudspeaker system includes a primary driver and an active radiator sealed within an enclosure so that the primary driver and the active radiator share the same acoustic volume of the enclosure. In other words, the primary driver and the active radiator share a common acoustic compliance of the enclosure. The primary driver has electromagnetic components designed to oscillate a flexible cone or diaphragm along the longitudinal axis of the primary driver. The primary driver is provided with an audio signal from an audio signal source such as an amplifier. The primary driver converts the audio signal source to sound waves by rapidly oscillating the flexible cone or diaphragm forwards and backwards along the longitudinal axis corresponding to the audio signal. As the diaphragm of the primary driver oscillates back and forth, the active radiator may also radiate as a result of sharing the same acoustic volume with the primary driver.

The active radiator has electromagnetic components that may be controlled by a number of electrical configuration settings. Each electrical configuration setting may affect the operating characteristics (excursion properties) of a diaphragm of the active radiator. With the primary driver and the active radiator sharing the same acoustic volume or compliance, varying the excursion properties of the diaphragm for the active radiator in turn affects the excursion properties of the diaphragm for the primary driver. As such, the sound pressure level generated by the primary driver can be tuned by varying the configuration setting provided to the active radiator. This allows a user or processor to tune the operating characteristics of the loudspeaker system by varying the electrical configuration setting provided to the active radiator rather than through altering the mechanical properties of the active radiator.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION OF THE INVENTION

Figure 1:
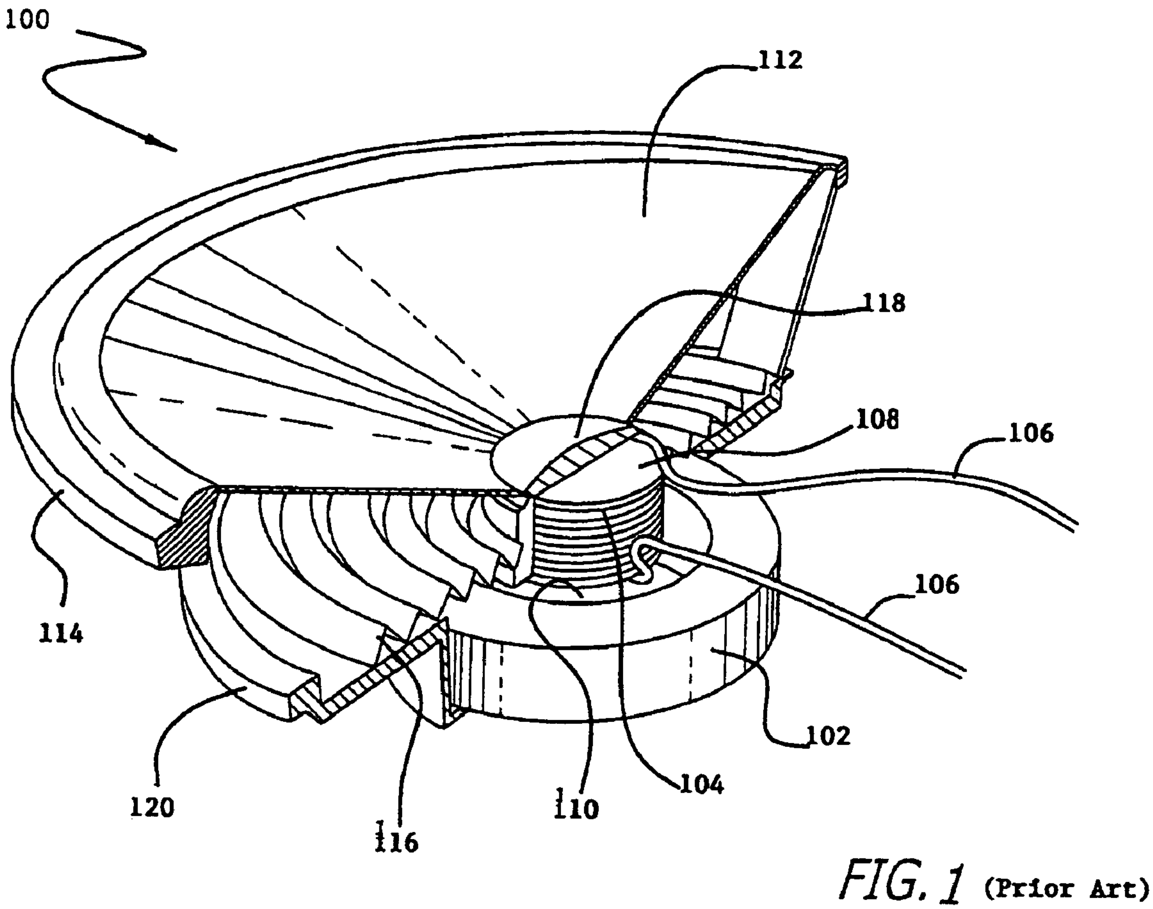
FIG. 1 (Prior Art)
FIG. 1 is a sectional view illustrating a typical primary driver.
Figure 2:
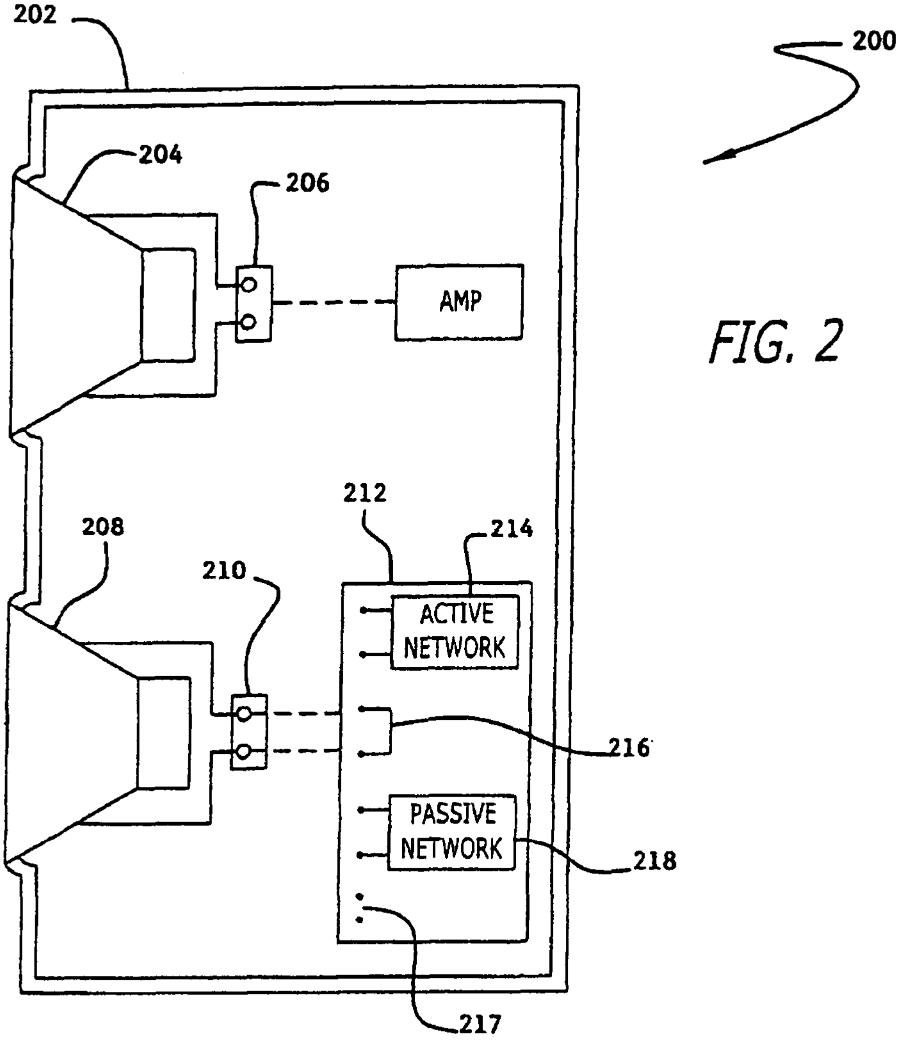
FIG. 2 is a cross-sectional view of a loudspeaker system having a primary driver and an active radiator system housed in a sealed enclosure.

FIG. 2 is a cross-sectional view of a loudspeaker system 200 having an active radiator 208 designed to tune the operational characteristics of a primary driver 204 housed within a sealed enclosure 202. The primary driver 204 converts audio signal to corresponding audible sound. The primary driver 204 has electromagnetic components adapted to convert electrical audio signal to acoustical energy to produce sound. The electromagnetic components of the primary driver 204 include a voice coil disposed within a voice coil gap. Two leads from the voice coil may be communicably coupled to input terminals 206 of the primary driver 204. Audio signals from an amplifier or a crossover network (not shown) may be provided to the input terminals 206 to drive the primary driver 204 to produce sound. The active radiator 208 has electromagnetic components with input terminals 210. The input terminals 210 are adapted to communicably couple to a configuration unit 212 having a number of electrical configuration settings such as: (1) an active network 214; (2) a wire 216 that bridges the two input terminals to short the two input terminals 210; (3) an open terminal 217, and (4) passive network 218. Each of the electrical configurations can vary the performance of the loudspeaker system 200 depending on the application of the loudspeaker 200 as further explained below.

Figure 3:
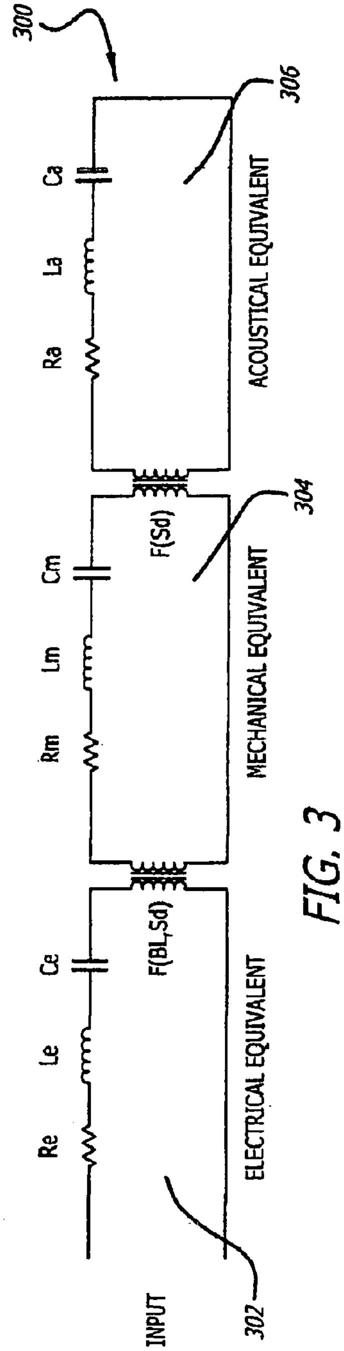
FIG. 3 is a circuitry that substantially represents a loudspeaker system having one driver housed in a sealed enclosure.

FIG. 3 illustrates a circuitry 300 that substantially represents the operational characteristics of a loudspeaker system having one driver housed in a sealed enclosure. The circuitry 300 divides the electromagnetic components of the primary driver into three equivalent circuits: (1) an electrical equivalent 302; (2) a mechanical equivalent 304; and (3) an acoustical equivalent 306. An audio electrical signal may be provided to the input side of the electrical equivalent 302. The electrical equivalent 302 factors in electrical resistance (Re), inductance (Le), and capacitance (Ce) of the loudspeaker system. For instance, Re and Le may factor in the resistance and inductance in the voice coil of the driver, respectively. The mechanical equivalent 304 may factor in mechanical resistance (Rm), mass (Lm), and compliance (Cm) of the loudspeaker system. For instance, Rm may factor in the inherent resistance to vibration of the diaphragm due to the spider and suspension. The acoustical equivalent 306 may factor in the acoustical resistance (Ra), acoustical mass (La), and acoustical compliance (Ca) of the loudspeaker system. The Ra may factor in the resistance to vibrating the diaphragm due to the size of the diaphragm, and the Ca may factor in the acoustical compliance due to the space within the enclosure. The transfer function F(Sd) between the acoustical equivalent 306 and the mechanical equivalent 304 may represent a function of the surface area of the diaphragm (Sd). The transfer function F(BL, Sd) between the mechanical equivalent the electrical equivalent may represent a function of Sd and magnetic field strength defined as the (BL) product.

Figure 4:
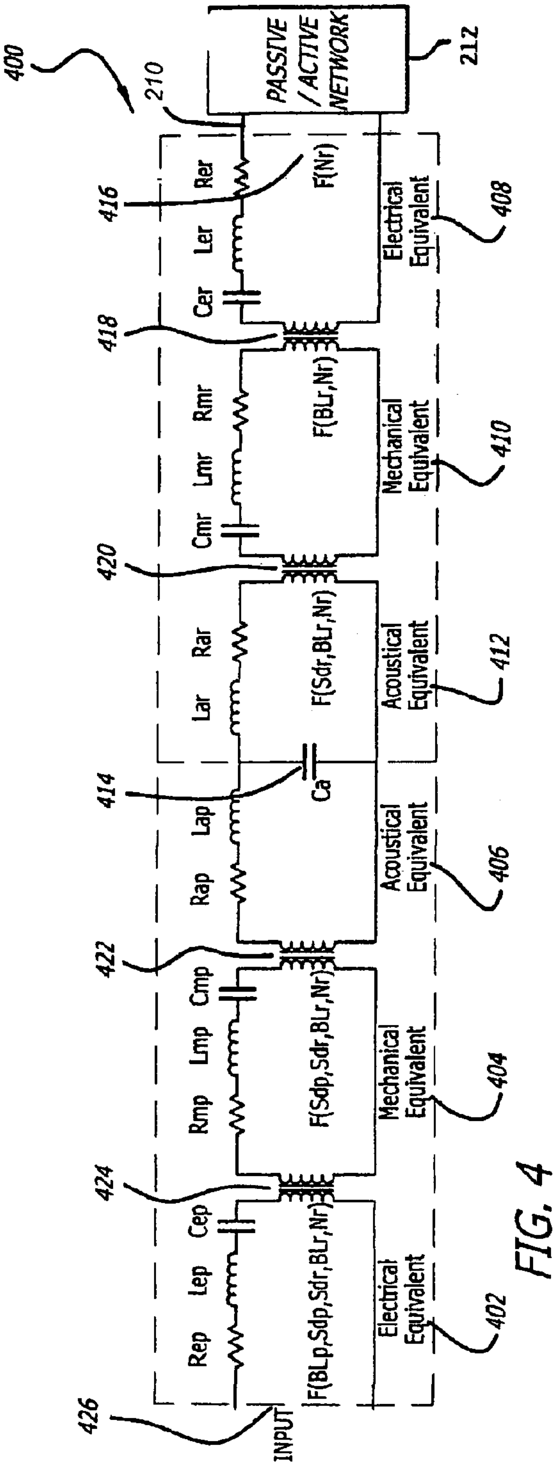
FIG. 4 is a circuitry equivalent to a loudspeaker system having a primary driver and an active radiator both sealed within a sealed enclosure.

FIG. 4 illustrates a circuitry 400 that substantially represents the operational characteristics of a loudspeaker system 200 having a primary driver 204 and an active radiator 208, both sealed within the enclosure 202. The primary driver 204 may be represented by an electrical equivalent 402, mechanical equivalent 404, and acoustical equivalent 406. The active radiator 208 may be represented by an electrical equivalent 408, mechanical equivalent 410, and acoustical equivalent 412. The acoustical compliance (Ca) 414 may be common to the primary acoustical equivalent 406 and the active acoustical equivalent 412. That is, the Ca 414 is an equivalent circuit element representing acoustical compliance of the enclosure volume shared by both primary and active radiators 204 and 208, respectively. The electrical equivalent circuit 408 of the active radiator 208 has input terminals 210 that are adapted to communicably couple to the configuration unit 212.

The function F(Nr) 416 corresponds to the setting in the configuration unit 212 such as the active circuit 214, short circuit 216, open circuit 217, and passive circuit 218, where each setting may vary the operating characteristics of the primary driver 204. The electrical equivalent 408 of the active radiator 208 is represented by capacitor Cer, the inductor Ler, and the resistor Rer. The function F(BLr, Nr) 418 represents the product of the electrical equivalent 408 and the function F(Nr) 416 corresponds to the setting in the configuration unit 212. If the configuration unit 212 is set to an open circuit 217, then the active radiator 208 operates as a passive radiator, such that there is an acoustical contribution from the active radiator. In other words, with the open circuit 217, other than the additional mass due to the voice coil and the compliance of the spider in the active radiator 208, the active radiator 208 may perform more like a traditional passive radiator without the electromagnetic components and which shares the same acoustic volume with the primary driver 204.

The configuration unit 212 may provide an option of selecting a short circuit 216 so that the input terminals 210 can be closed, thereby closing the electrical equivalent circuit 408. The function F(BLr, Nr) 418 is a function of F(Nr) and the electrical equivalent circuit 408 of the active radiator 208. With the configuration unit 212 set to the short circuit 216, or zero resistance, F(BLr, Nr) 418=the electrical equivalent circuit 408 of the active radiator 208. Likewise, the function F(Sdr, BLr, Nr) 420 is a function of F(BLr, Nr) 418 and the mechanical equivalent 440 of the active radiator 208. In general, the mechanical equivalent 440 of the active radiator 208 may be associated with the surface area of the diaphragm (Sdr) of the active radiator 208. As such, the function F(Sdr, BLr, Nr) 420 is a function of F(BLr, Nr) 418 and Sdr of the active radiator 208. That is, the combined electrical equivalent 408 and the mechanical equivalent 410 of the active radiator 208 is represented by the equivalent function F(Sdr, BLr, Nr) 420. Likewise, the combined electrical and mechanical equivalent F(BLr, Nr) 418 and the acoustical equivalent 412 of the active radiator 208 and the acoustical equivalent 406 of the primary driver 204 may be represented by the equivalent function F(Sdp, Sdr, BLr, Nr) 422. Note that Sdp represents the surface area of the primary driver 204. The function F(BLp, Sdp, Sdr, BLr, Nr) 424 may be represented by combination of F(Sdp, Sdr, BLr, Nr) 422 and the mechanical equivalent 404 of the primary driver 204. The function 424 can be combined with the overall output of the loudspeaker system 200. Note that the Ca 414 representing the acoustical compliance of the enclosure volume shared between the primary driver 202 and the active radiator 204 is a variable of the overall function 424. A user and/or designer may selectively choose a circuit from the configuration unit 212 to tune the performance of the primary driver 204 contained in the enclosure 202.

As illustrated in FIG. 2, the configuration unit 212 includes a number of circuit configurations such as an active network 212, short circuit 216, open circuit 217, and passive network 218. With the active radiator 208 having electromagnetic components, the input terminals 210 of the active radiator 208 may be connected to the variable configuration unit 212 to provide an active circuit 214, short circuit 216, open circuit 217, and/or passive circuit 218 to the active radiator 208 to vary the operating characteristics of the active radiator 208. For example, the active circuit 214 may provide an electrical signal to the active radiator 208 to adjust the excursion range of its diaphragm. Adjusting the operating characteristics of the active radiator 208 in turn influences the overall output of the primary driver 204 because the primary driver 204 and the active radiator 208 share a common enclosure 202 or Ca 414. For instance, as the primary driver 204 radiates back and forth, compression and rarefaction occur inside of the enclosure 202. The pressure variations inside of the enclosure 202 cause the active radiator 208 to vibrate back and forth as well. The excursion properties of the active radiator 208, however, depend on the circuit configuration that is provided to the input terminals 210 of the active radiator 208. Accordingly, varying the circuit configuration provided to the input terminals 210 of the active radiator 208 can influence the performance of the primary driver 204.

The configuration unit 212 may also provide the short circuit 216 to the input terminals 210 of the active radiator 210 to complete the circuit in the active radiator 208 such that the oscillation of the voice coil in the magnetic gap of the active radiator 208 induces current through its voice coil. The induced current through the voice coil of the active radiator 208 in turn generates an opposing magnetic flux in the magnetic components of the active radiator 208 to resist the oscillating movement of the voice coil of the active radiator 208. As such, the configuration unit 212 includes a number of circuits to allow a user or processor to select a desired circuit provided to the active radiator 208 to change its operating characteristics in order to tune the operating characteristics of the primary driver 204.

Figure 5:
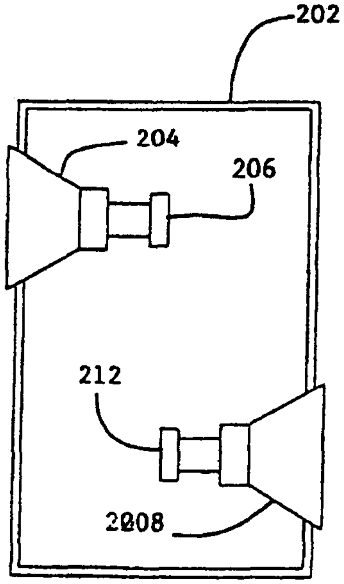
FIG. 5 is a cross-sectional view of a loudspeaker system having a primary driver and an active radiator facing away from each other housed in a sealed enclosure.
Figure 6:
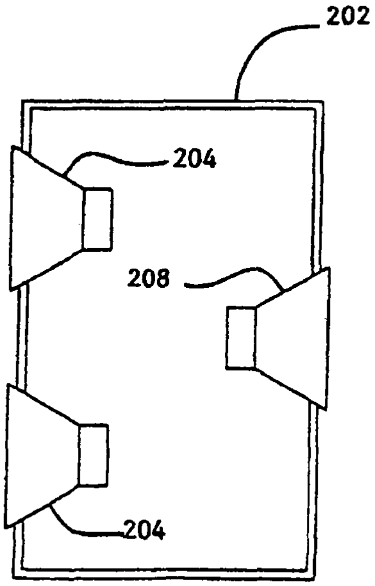
FIG. 6 is a cross-sectional view of a loudspeaker system having two primary drivers and one active radiator, where the active radiator faces away from the two primary drivers within a sealed enclosure.

The loudspeaker system 200 may include one or more primary drivers 204 arranged in a variety of ways with respect to the active radiator 208. Likewise, two or more active radiators 208 may be incorporated into the enclosure 202. For instance, FIG. 5 illustrates a primary driver 204 and an active radiator 208 facing away from each other within the sealed enclosure 202. FIG. 6 illustrates two primary drivers 204 facing the same direction but in opposite direction of the active radiator 208 within the sealed enclosure 202. As such, more than one primary driver and active radiator may be positioned in a variety of ways within a sealed enclosure.

FIGS. 7 through 12 illustrate two sound pressure level (SPL) plots generated by a loudspeaker 200 based on two different settings in the configuration unit 212 for comparison purposes. The SPLs were measured using a loudspeaker system 200 having one primary driver 204 and one active radiator 208 facing in opposite directions within a sealed enclosure 202, as illustrated in FIG. 5. A microphone was placed perpendicular to the primary driver 204 to measure the SPL generated by the primary driver 204. FIGS. 7 through 12 illustrate a plot line 702 representing the measured SPL from the primary driver 204, when the setting for the configuration unit 212 was left opened, i.e., the input terminals 210 to the active-radiator 208 was provided with the open circuit 217. With the input terminals 210 being open, the active radiator 208 behaved more like a traditional passive radiator without the electromagnetic component. For comparison purposes, a second plot line is provided in FIGS. 7 through 12 to analyze the differences between the plot line 702 and other plot lines when the configuration unit 212 provides different type of passive circuits to the input terminals 210 of the active radiator 208.

Figure 7:
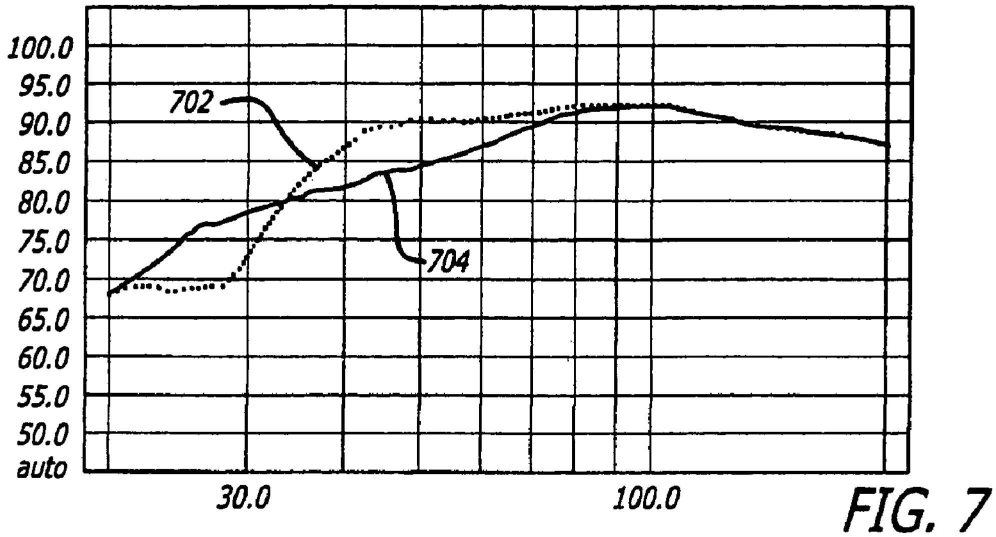
FIG. 7 is a graph showing a first plot line of sound pressure level (SPL) generated by a loudspeaker system of FIG. 5 when the input terminals for an active radiator is open and a second plot line when the input terminal for an active radiator is shorted.

FIG. 7 illustrates a plot line 704 representing the measured SPL from the primary driver 204 when the configuration unit 212 was set to the short circuit 216. In other words, a wire was provided between the input terminals 210 to close the circuit. The two plot lines 702 and 704 indicate that below about 35 Hz, the plot line 704 (short circuit) has a higher SPL than the plot line 702 (open circuit) and cross-over takes place at about 35 Hz. Between about 35 Hz and about 80 Hz, the plot line 704 (short circuit) has lower SPL than the plot line 702 (open circuit). That is, when the configuration unit 212 was set at the short circuit 216, the plot line 704 indicates that below about 35 Hz—the SPL from the primary driver 204 is boosted, while dampening the SPL between 35 Hz and 80 Hz as compared to the plot line 702. Such boosting of SPL below about 35 Hz may be used in a variety of applications. For example, in some instances when a loudspeaker is placed near a wall, the wall may reflect back additional energy to the listener's position in a frequency range of 40 Hz to 70 Hz. In such instances, a loudspeaker system 200 capable of generating SPL corresponding to the plot line 704 may be utilized to boost the SPL below about 35 Hz, while dampening between 35 Hz and 80 Hz to even out the response in the listening room.

Figure 8:
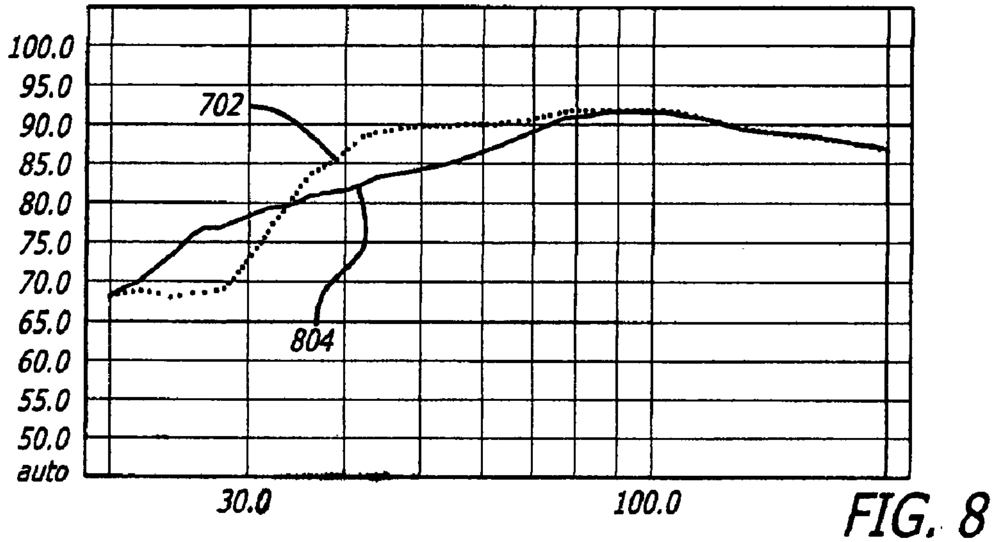
FIG. 8 is a graph showing a first plot line of SPL generated by a loudspeaker system of FIG. 5 when the input terminals for an active radiator is open and a second plot line when the input terminal for an active radiator is provided with a resistor.

FIGS. 8 through 12 show plot lines based on the configuration unit 212 providing a variety of passive circuits 218 to the input terminals 210 of the active radiator 208. For instance, FIG. 8 shows a plot line 804 representing the measured SPL from the primary driver 204 with a resistor R1 provided at the input terminals 210 of the active radiator 208. The plot line 804 illustrate that the SPL generated by the primary driver 204 appears substantially similar to the plot line 704 of FIG. 7. That is, providing a resistor R1 or a short circuit 216 across the input terminals 210 of the active radiator 208 generates a substantially similar SPL from the primary driver 204.

Figure 9:
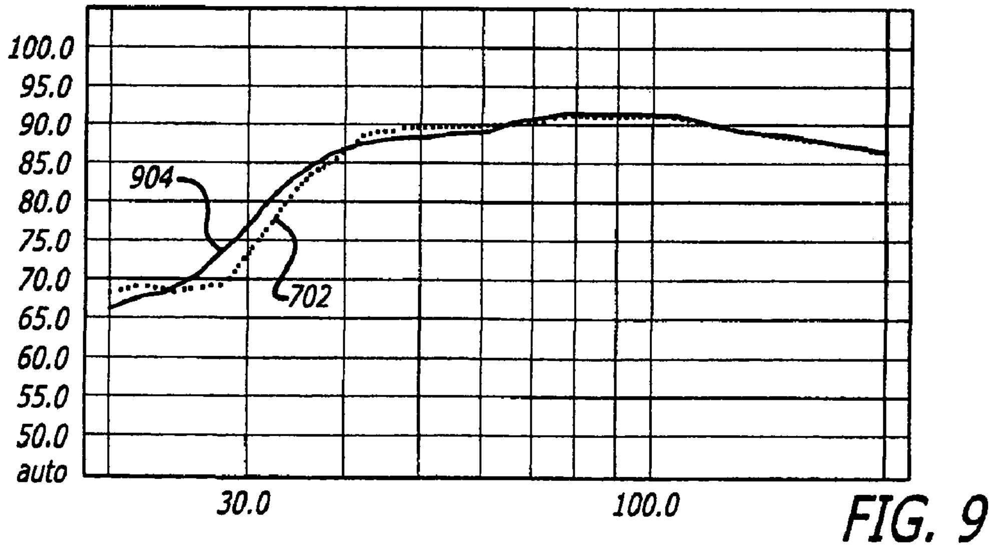
FIG. 9 is a graph showing a first plot line of SPL generated by a loudspeaker system of FIG. 5 when the input terminals for an active radiator is open and a second plot line when the input terminal for an active radiator is provided with a resistor and a capacitor.

FIG. 9 illustrates a plot line 904 representing the measured SPL from the primary driver 204 when the passive circuit 218 having a resistor R1 in series with a capacitor C1 is provided to the input terminals 210 of the active radiator 208. Comparing the two plot lines 702 and 904, the plot line 904 indicates that by adding a simple passive circuit 218 such as R1 and C1 to the input terminals 210 of the active radiator 208, the primary driver 204 generates additional SPL below about 40 Hz a, while SPL is dampened above 40 Hz. In applications where boost in SPL would be desirable below 40 Hz with nominal dampening above 40 Hz, a passive circuit 218 having a resistor R1 in series with a capacitor C1 may be provided at the input terminals 210 of the active radiator 208.

Figure 10:
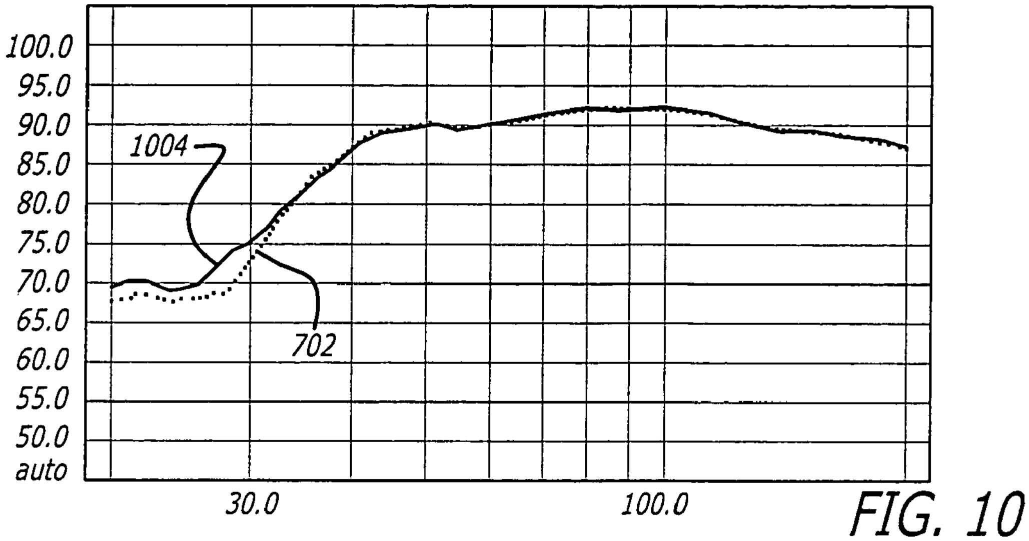
FIG. 10 is a graph showing a first plot line of SPL generated by a loudspeaker system of FIG. 5 when the input terminals for an active radiator is open and a second plot line when the input terminal for an active radiator is provided with resistor, capacitor, and inductor in series.

FIG. 10 illustrates a plot line 1004 representing the measured SPL from the primary driver 204 when the passive circuit 218 having a resistor R1, C2, and L1 in series is provided at the input terminals 210 of the active radiator 208. Comparing the two plots 702 and 2004, the plot line 2004 indicates that by providing a simple passive circuit 218 with R1, C2, and L1 in series to the input terminals 210 of the active radiator 208, the primary driver 204 generates additional SPL below about 35 Hz, while generating substantially similar SPL, as the plot line 702, above 35 Hz. As such, by providing a simple passive circuit having R1, C2, and L1 in series to the input terminals 210 of the active radiators 208, additional boost can be obtained below 35 Hz without losing SPL above 35 Hz. In other words, the plot line 1004 indicates that the loudspeaker system 200 would produce a deeper bass sound without dampening the mid and high end of the bass sound.

Figure 11:
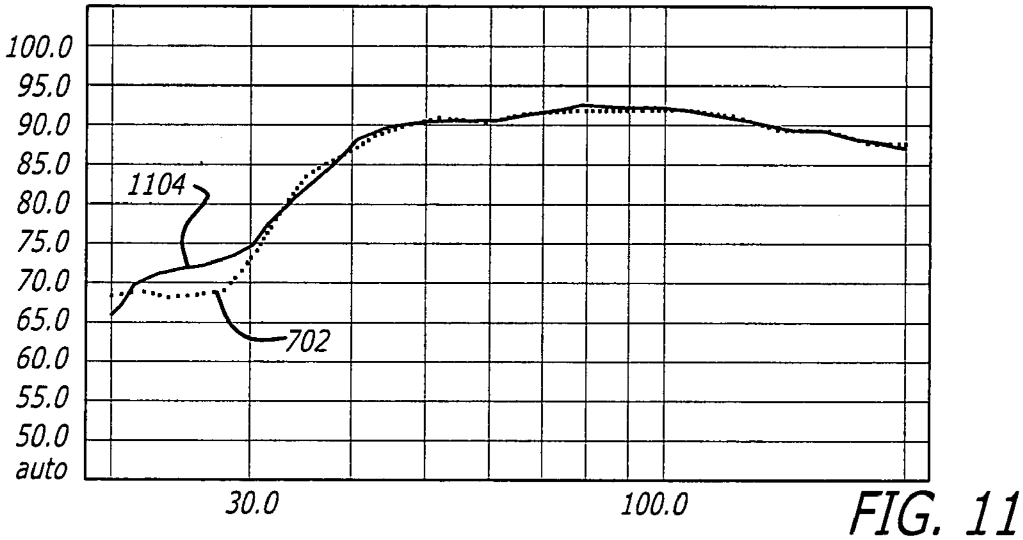
FIG. 11 is a graph showing a first plot line of SPL generated by a loudspeaker system of FIG. 5 when the input terminals for an active radiator is open and a second plot line when the input terminal for an active radiator is provided with resistor, a different capacitor, and inductor in series.

FIG. 11 illustrates a plot line 1104 representing the measured SPL from the primary driver 204 when the passive circuit 218 having a resistor R1, C3, and L1 in series is provided at the input terminals 210 of the active radiator 208. Comparing the two plots 702 and, 1104 the plot line 1104 indicates that providing a simple passive circuit having R1, C3, and L1 in series to the input terminals 210 of the active radiators 208, additional boost can be obtained below 35 Hz without losing SPL above 35 Hz. In addition, comparing the two plot lines 1104 and 1004 indicates that using C3 in the active circuit 218 in place of C2 generates additional SPL from the primary driver 204 below about 30 Hz.

Figure 12:
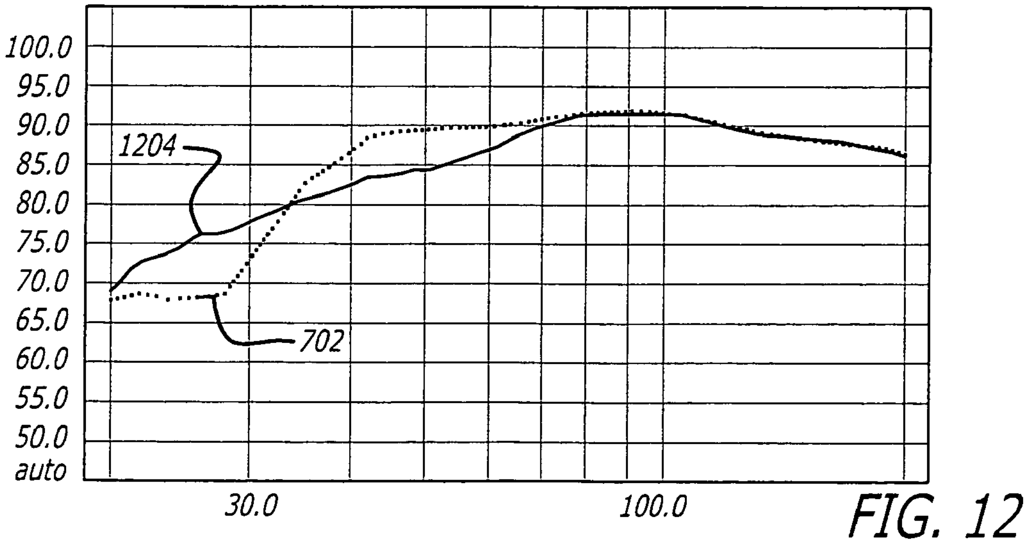
FIG. 12 is a graph showing a first plot line of SPL generated by a loudspeaker system of FIG. 5 when the input terminals for an active radiator is open and a second plot line when the input terminal for an active radiator is provided with capacitor and inductor in series.

FIG. 12 illustrates a plot line 1204 representing the measured SPL from the primary driver 204 when the passive circuit 218 having C3 and L1 in series is provided at the input terminals 210 of the active radiator 208. The plot line 1204 is substantially similar to the plot lines 704 and 804 indicating that a resistor and a capacitor may be needed to minimize the dampening that may occur above 35 Hz.

FIGS. 7 through 12 illustrate that by providing simple passive circuits to the input terminals 210 of the active radiator 208, the performance of the loudspeaker system 200 may be tuned, dampened, or boosted along the low, mid, and high frequency range of the bass. This allows a user to tune the operating characteristics of the loudspeaker system 200 by varying the electrical configuration setting provided to the active radiator 208 rather than through changing the mechanical properties of the active radiator 208. The SPL generated by the primary driver 204 may vary depending on the type of primary driver 204, active radiator 208, and the circuit provided to the input terminals 210 of the active radiator 208. In addition, a number of different types of active and/or passive circuits may be provided through the configuration unit 212. For example, active circuits such as operational amplifiers or a series of tuning circuits that require an external power supply may be provided to the input terminals 210 of the active radiator 208. As another example, when coupling the active radiator 208 to an active circuit 214 such as a partition of an excursion limiting circuit, the active radiator 208 may be used as a mechanical servomechanism to limit the excursion of the primary driver 204. In addition, a variable active notch filter may be provided at the input terminals 210 of the active radiator 208 to tune the loudspeaker system 200 at one or more frequencies.

Figure 13:
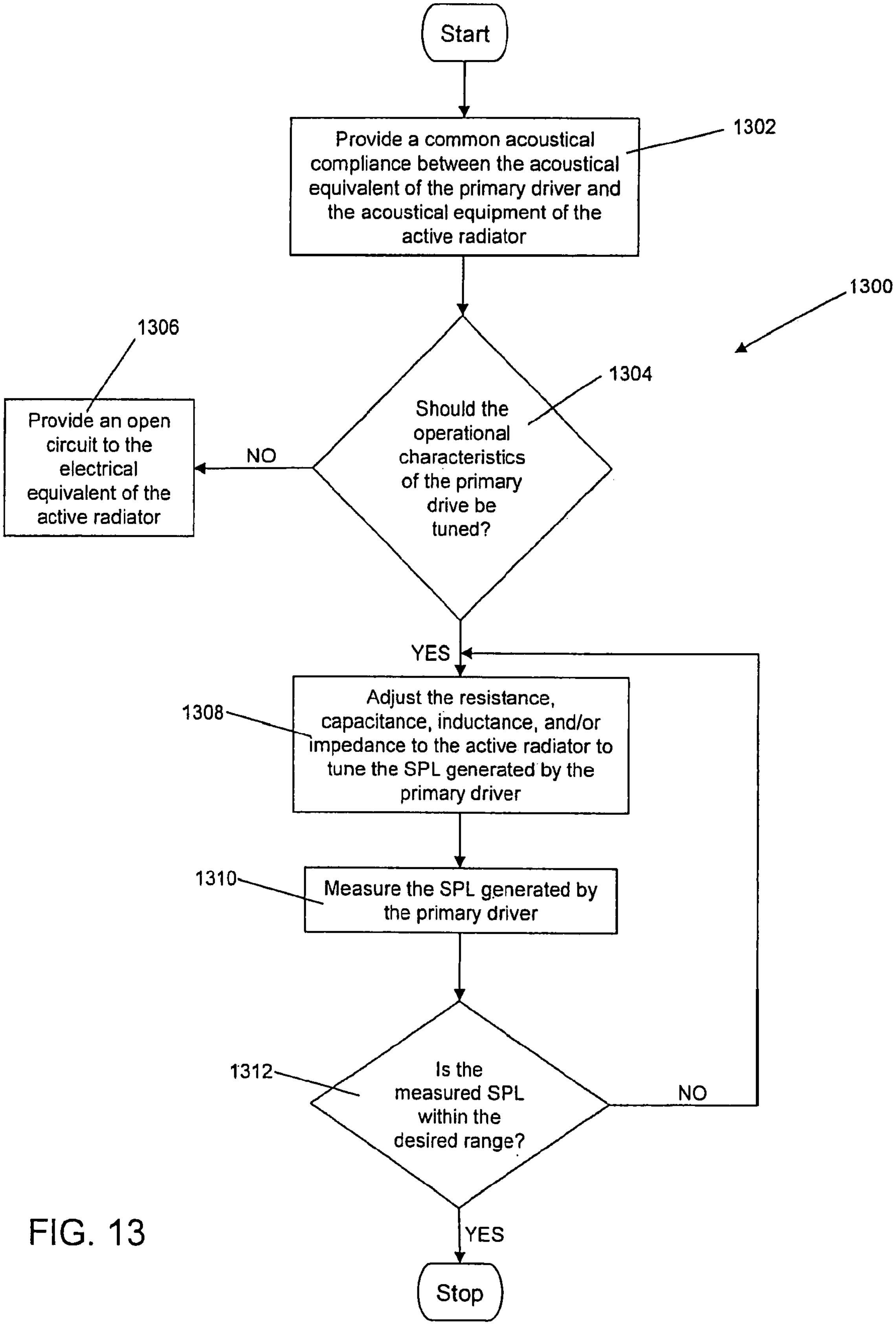
FIG. 13 is a flow chart illustrating a process that may be used to tune the loudspeaker system.

FIG. 13 shows a flow chart 1300 illustrating a process that may be used to tune the loudspeaker system 200. In block 1302, a loudspeaker system 200 may be provided with a common acoustical compliance between the acoustical equivalent 406 of the primary driver 204 and the acoustical equivalent 412 of the active radiator 208. In a decision block 1304, a decision may be made as to whether the operational characteristics of the primary driver 204 should be tuned. If no tuning is required, then in block 1306, an open circuit 217 may be provided to the electrical equivalent 408 of the active radiator 208. On the other hand, if tuning is required, then in block 1308, at least a portion of the resistance, capacitance, and/or inductance to the electrical equivalent 408 of the active radiator 208 may be adjusted to tune the SPL generated by the primary driver 204. The tuning may be accomplished by selecting the active circuit 214, short circuit 216, or passive circuit 218 from the configuration unit 212, for example.

The flow chart 1300 also illustrates that a feed back system may be incorporated into the process. In block 1310, the SPL generated by the primary driver 204 may be measured. In the decision block 1312, the measured SPL from the primary driver 204 may be compared to a desired SPL range. The desired SPL range may be established by an operator. The desired SPL range may be also stored in a look-up-table for comparison. If the measured SPL is within the desired SPL range, then the process may stop. On the other hand, if the measured SPL is not within the desired SPL range, then the process may go back to the block 1308 to readjust the resistance, capacitance, and/or inductance provided to the electrical equivalent 408 of the active radiator 208 until the measured SPL is within the desired range.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A loudspeaker system comprising:

a primary driver configured for converting an audio signal to a corresponding sound;

an active radiator including one or more electromagnetic components and a pair of input terminals communicating with the one or more electromagnetic components where the active radiator is not connected to receive the electrical audio signal at the pair of input terminals;

an enclosure having an acoustical compliance and sealing the primary driver and the active radiator, where the primary driver and the active radiator share the acoustical compliance; and an adjustable configuration unit including a plurality of different predetermined electrical circuits selectively coupled to the input terminals, each of the plurality of electrical circuits configured for altering the operating characteristics of the active radiator to adjust the operating characteristics of the primary driver.

2. The loudspeaker system according to claim 1, where the plurality of different electrical circuits is selected from the group consisting of two or more of the following: an open circuit, a short circuit, an active circuit, and a passive circuit.

3. The loudspeaker system according to claim 1, where the one or more electromagnetic components of the active radiator includes an electrical resistance, an electrical inductance, and an electrical capacitance, and the adjustable configuration unit is configured for varying the electrical resistance, electrical inductance, and electrical capacitance of the active radiator to vary the acoustical compliance of the enclosure, thereby adjusting the sound generated by the primary driver.

4. The loudspeaker system according to claim 1, where the plurality of different electrical circuits includes an active circuit, and the active circuit includes an operational amplifier or a series of tuning circuits having an external power supply.

5. The loudspeaker system according to claim 1, where the primary driver and the active radiator are mounted to the enclosure to face the same direction.

6. The loudspeaker system according to claim 1, where the primary driver and the active radiator are mounted to the enclosure to face the opposite direction with respect to each other.

7. The loudspeaker system according to claim 1, where the primary driver includes one or more electromagnetic components, and the respective electromagnetic components of the primary driver and the active radiator are substantially similar.

8. The loudspeaker system according to claim 1, where the plurality of different electrical circuits includes a passive circuit, and the passive circuit includes a resistor, a capacitor, and an inductor in series and provided to the input terminals of the active radiator to boost the sound pressure level generated by the primary driver at a low-frequency range of bass as compared to providing an open circuit to the input terminals of the active radiator.

9. The loudspeaker system according to claim 1, where the primary driver has a diaphragm with an excursion range, and the plurality of different electrical circuits includes an active circuit provided to the input terminals of the active radiator to limit the excursion range of the diaphragm of the primary driver.

10. The loudspeaker system according to claim 1, where a variable notch filter is provided to the input terminals of the active radiator to tune the primary driver at one or more frequencies.

11. A loudspeaker system comprising:

a primary driver capable of converting audio electrical energy to sound;

an active radiator including one or more electromagnetic components with electrical resistance, electrical inductance, and electrical capacitance, the active radiator and the primary driver sharing a common acoustical compliance within a sealed enclosure where the active radiator is not connected to receive the audio electrical energy; and an adjustable configuration unit including a plurality of different predetermined configuration settings, each said configuration setting configured for adjusting the electrical resistance, the electrical inductance, and the electrical capacitance of the active radiator to adjust the common acoustical compliance to tune the sound pressure level generated by the primary driver.

12. The loudspeaker system according to claim 11, where the adjustable configuration unit is configured for coupling a desired electrical circuit to the active radiator, the desired electrical circuit being selected from a plurality of different electrical circuits corresponding to the plurality of different configuration settings, and where the plurality of different electrical circuits is selected from two or more of the following: an open circuit, a short circuit, an active circuit, and a passive circuit.

13. The loudspeaker system according to claim 11, where the plurality of different configuration settings includes a configuration setting at which an active circuit communicates with the active radiator, and the active circuit is capable of varying the electrical resistance, the electrical inductance, and the electrical capacitance of the active radiator to vary the acoustical compliance of the sealed enclosure, thereby adjusting the sound generated by the primary driver.

14. The loudspeaker system according to claim 11, where the plurality of different configurations settings includes a configuration setting at which an active circuit communicates with the active radiator, and the active circuit includes an operational amplifier or a series of tuning circuits having an external power supply.

15. The loudspeaker system according to claim 11, where the primary driver and the active radiator are mounted to the enclosure to face the same direction.

16. The loudspeaker system according to claim 11, where the primary driver and the active radiator are mounted to the enclosure to face the opposite direction with respect to each other.

17. The loudspeaker system according to claim 11, where the primary driver includes one or more electromagnetic components, and the respective electromagnetic components of the primary driver and the active radiator are substantially similar.

18. The loudspeaker system according to claim 11, where the plurality of different configuration settings includes a configuration setting at which a passive circuit communicates with the active radiator, the passive circuit including a resistor, a capacitor, and an inductor in series and provided to the input terminals of the active radiator to boost the sound pressure level generated by the primary driver at a low-frequency range of bass as compared to providing an open circuit to the input terminals of the active radiator.

19. The loudspeaker system according to claim 11, where the primary driver has a diaphragm with an excursion range, and the plurality of different configuration settings includes a configuration setting at which an active circuit communicates with the active radiator to limit the excursion range of the diaphragm of the primary driver.

20. The loudspeaker system according to claim 11, where a variable notch filter communicates with the active radiator to tune the primary driver at one or more frequencies.

21. A method of varying sound pressure level generated from a loudspeaker system having an enclosure sealing a primary driver that is able to receive an electrical audio signal and an active radiator not connected to receive the electrical audio signal, the method comprising:

incorporating one or more electromagnetic components into the active radiator;

providing a common acoustic compliance between the primary driver and the active radiator; and selecting a desired circuit from a plurality of different predetermined circuits of a configuration unit of the loudspeaker system by adjusting the configuration unit, the desired circuit coupled to the one or more electromagnetic components of the active radiator to adjust the common acoustic compliance, thereby varying the sound pressure level generated by the primary driver.

22. The method according to claim 21, where the plurality of different circuits is selected from two or more of the following: an open circuit, a short circuit, an active circuit, and a passive circuit.

23. The method according to claim 21, where the one or more electromagnetic components of the active radiator includes an electrical equivalent, and where adjusting the configuration unit includes adjusting an electrical resistance, an electrical inductance, and an electrical capacitance of the electrical equivalent of the active radiator to adjust the common acoustic compliance, thereby tuning the sound pressure level generated by the primary driver.

24. The method according to claim 21, including boosting the sound pressure level generated by the primary driver at a low-frequency range of bass as compared to providing an open circuit to the active radiator.

25. The method according to 21, where the primary driver has a diaphragm with an excursion range, and selecting includes coupling an active circuit the active radiator to limit the excursion range of the diaphragm of the primary driver.

26. The method according to 21, further including measuring the sound pressure level generated by the primary driver and determining whether the measured sound pressure level is within a desired sound pressure level range, and where, if it is determined that the measured sound pressure level is not within the desired sound pressure level range, selecting the desired circuit includes adjusting an electrical characteristic of the active radiator, the electrical characteristic being selected from the group consisting of a resistance provided to the active radiator, a capacitance provided to the active radiator, an inductance provided to the active radiator, and combinations of two of more of the foregoing.

27. A method of tuning a loudspeaker system having a primary driver able to receive an electrical audio signal and an active radiator not connected to receive the electrical audio signal, the method comprising:

incorporating an electrical equivalent, a mechanical equivalent, and an acoustical equivalent to the active radiator;

providing a common acoustical compliance between an acoustical equivalent of the primary driver and the acoustical equivalent of the active radiator;

coupling a configuration predetermined unit to the electrical equivalent side of the active radiator, the configuration unit including a plurality of different predetermined electrical circuits; and selecting at least one of the different predetermined electrical circuits for communication with the active radiator to tune the sound pressure level generated by the primary driver.

28. The method according to claim 27, where the plurality of different electrical circuits is selected from the group consisting of two of more of the following: an open circuit, a short circuit, an active circuit, and a passive circuit.

29. The method according to claim 27, where the electrical equivalent of the active radiator includes electrical resistance, electrical inductance, and electrical capacitance, and where selecting adjusts the electrical resistance, electrical inductance, and electrical capacitance of the electrical equivalent of the active radiator to adjust the common acoustic compliance, thereby tuning the sound pressure level generated by the primary driver.

30. The method according to claim 27, including boosting the sound pressure level in the low-frequency range of bass sound without dampening the mid and high end of the bass sound.

31. The method according to claim 27, where the primary driver has a diaphragm with an excursion range, and selecting includes coupling an active circuit the active radiator to limit the excursion range of the diaphragm of the primary driver.

32. The method according to 27, further including measuring the sound pressure level generated by the primary driver and determining whether the measured sound pressure level is within a desired sound pressure level range, and where, if it is determined that the measured sound pressure level is not within the desired sound pressure level range, selecting the at least one electrical circuit includes adjusting an electrical characteristic of the active radiator, the electrical characteristic being selected from the group consisting of a resistance provided to the active radiator, a capacitance provided to the active radiator, an inductance provided to the active radiator, and combinations of two of more of the foregoing.

33. A loudspeaker system capable of tuning sound pressure generated by a primary driver, the loudspeaker system comprising:

an enclosure housing a primary driver able to receive an electrical audio signal and an active radiator not connected to receive the electrical audio signal, the primary driver and the active radiator sharing a common acoustic compliance of the enclosure; and means for selecting a desired electrical circuit from a plurality of different electrical circuits included with the loudspeaker system and for coupling the desired electrical circuit to the active radiator, each electrical circuit configured for adjusting the common acoustic compliance through the active radiator to tune the sound pressure level generated by the primary driver.

34. The loudspeaker system according to claim 33, where the active radiator has an electrical equivalent that includes a resistance equivalent, an inductance equivalent, and a capacitance equivalent, and where the means for selecting and coupling includes an adjustable configuration unit configured for adjusting the resistance equivalent, the inductance equivalent, and the capacitance equivalent of the electrical equivalent of the active radiator to adjust the common acoustic compliance, thereby tuning the sound pressure level generated by the primary driver.

35. The loudspeaker system according to claim 33, including means for boosting the sound pressure level generated by the primary driver in the low frequency range of bass sound without dampening the mid and high end of the bass sound.

36. The loudspeaker system according to claim 33, where the primary driver and the active radiator each include one or more electromagnetic components, and the respective electromagnetic components of the primary driver and the active radiator are substantially similar.

37. A loudspeaker system capable of tuning the sound pressure level generated by a primary driver, the loudspeaker system comprising:

a primary driver having an electrical equivalent, a mechanical equivalent, and an acoustical equivalent, the primary driver capable of converting an audio electrical signal into acoustical energy to generate sound;

an active radiator having an electrical equivalent, a mechanical equivalent, and an acoustical equivalent, the two acoustical equivalents for the primary driver and the active radiator sharing a common acoustical compliance, where the active radiator is not connected to receive the electrical audio signal; and an adjustable configuration unit electrically communicating with the active radiator and including a plurality of different configuration settings, where the configuration unit is configured to be adjustable to the different configuration settings, and where adjustment varies the circuit provided to the electrical equivalent of the active radiator and adjusts the sound pressure level generated by the primary driver.

38. The loudspeaker system of claim 33, where the means for selecting and coupling includes an adjustable configuration unit included with the loudspeaker system, the adjustable configuration unit including the plurality of different electrical circuits.

39. The loudspeaker system of claim 38, where the plurality of different electrical circuits is selected from the group consisting of two or more of the following: an open circuit, a short circuit, an active circuit, and a passive circuit.

40. The loudspeaker system of claim 33, where the plurality of different electrical circuits includes an active circuit, and the active circuit includes an operational amplifier or a series of tuning circuits having an external power supply.

41. The loudspeaker system according to claim 33, where the primary driver and the active radiator are mounted to the enclosure to face the same direction.

42. The loudspeaker system according to claim 33, where the primary driver and the active radiator are mounted to the enclosure to face the opposite direction with respect to each other.

43. The loudspeaker system according to claim 33, where the plurality of different electrical circuits includes a passive circuit, and the passive circuit includes a resistor, a capacitor, and an inductor in series and provided to the input terminals of the active radiator to boost the sound pressure level generated by the primary driver at a low-frequency range of bass as compared to providing an open circuit to the input terminals of the active radiator.

44. The loudspeaker system according to claim 33, where the primary driver has a diaphragm with an excursion range, and the plurality of different electrical circuits includes an active circuit provided to the input terminals of the active radiator to limit the excursion range of the diaphragm of the primary driver.

45. The loudspeaker system according to claim 33, where a variable notch filter communicates with the active radiator to tune the primary driver at one or more frequencies.

46. The loudspeaker system according to claim 37, where the adjustable configuration unit is configured for coupling a desired electrical circuit to the active radiator, the desired electrical circuit being selected from a plurality of different electrical circuits corresponding to the plurality of different configuration settings, and where the plurality of different electrical circuits is selected from two or more of the following: an open circuit, a short circuit, an active circuit, and a passive circuit.

47. The loudspeaker system according to claim 37, where the plurality of different configuration settings includes a configuration setting at which an active circuit is coupled to the active radiator, and the active circuit includes an operational amplifier or a series of tuning circuits having an external power supply.

48. The loudspeaker system according to claim 37, where the primary driver and the active radiator are mounted to the enclosure to face the same direction.

49. The loudspeaker system according to claim 37, where the primary driver and the active radiator are mounted to the enclosure to face the opposite direction with respect to each other.

50. The loudspeaker system according to claim 37, where the primary driver and the active radiator each include one or more electromagnetic components, and the respective electromagnetic components of the primary driver and the active radiator are substantially similar.

51. The loudspeaker system according to claim 37, where the plurality of different configuration settings includes a configuration setting at which a passive circuit is coupled to the active radiator, the passive circuit including a resistor, a capacitor, and an inductor in series and provided to the electrical equivalent of the active radiator to boost the sound pressure level generated by the primary driver at a low-frequency range of bass as compared to providing an open circuit to the electrical equivalent of the active radiator.

52. The loudspeaker system according to claim 37, where the primary driver has a diaphragm with an excursion range, and the plurality of different configuration settings includes a configuration setting at which an active circuit is provided to the electrical equivalent of the active radiator to limit the excursion range of the diaphragm of the primary driver.

53. The loudspeaker system according to claim 37, where a variable notch filter is provided to the electrical equivalent of the active radiator to tune the primary driver at one or more frequencies.

* * * * *